US006870361B2

(12) United States Patent
Chopra et al.

(10) Patent No.: US 6,870,361 B2
(45) Date of Patent: Mar. 22, 2005

(54) SYSTEM WITH NANO-SCALE CONDUCTOR AND NANO-OPENING

(75) Inventors: Nasreen G. Chopra, Belmont, CA (US); David Paul Basile, Corvallis, OR (US); Jene A. Golovchenko, Lexington, MA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/328,345

(22) Filed: Dec. 21, 2002

(65) Prior Publication Data

US 2004/0121525 A1 Jun. 24, 2004

(51) Int. Cl.[7] ........................ G01N 27/00; H01L 23/58; H01L 21/00
(52) U.S. Cl. .................... 324/158.1; 257/798; 438/800; 977/DIG. 1
(58) Field of Search ................................. 438/800, 197; 324/158.1; 257/798; 977/DIG. 1

(56) References Cited

U.S. PATENT DOCUMENTS

| 6,383,923 B1 | * | 5/2002 | Brown et al. ............... 438/666 |
| 2001/0006869 A1 | | 7/2001 | Okamoto et al. |
| 2001/0023986 A1 | | 9/2001 | Mancevski |
| 2002/0001905 A1 | | 1/2002 | Choi et al. |
| 2002/0014667 A1 | | 2/2002 | Shin et al. |

FOREIGN PATENT DOCUMENTS

WO     WO 01/44796     6/2001

OTHER PUBLICATIONS

Bohr, M.T., "Nanotechnology goals and challenges for electronic applications", Mar. 2002, IEEE Transactions on Nanotechnology, pp. 56–62.*

Martel et al., "Carbon Nanotube Field Effect Transistors for Logic Applications", Dec. 2001, IEDM Technical International Electron Devices Meeting, pp. 7.5.1–7.5.4.*

Martel et al., "Carbon Nanotube Field–Effect Transistors and Logic Circuits", Jun. 2002, Proceedings of the 2002 Design Automation Conference, pp. 94–98.*

Wind et al., "Vertical scaling of carbon nanotube field–effect transistors using top gate electrodes", May 2002, Applied Physics Letters, vol. 80, No. 20, pp. 3817–3819.*

Wright et al., "Integrated Circuit Test Sensors using Semiconducting Nanotubes", Aug. 2001, IEEE Systems Technology Conference, AUTOTESTCON Proceedings, pp. 276–283.*

Huang et al., "Logic Gates and Computation from Assembled Nanowire Building Blocks", Nov. 2001, vol. 294, pp. 1313–1317.*

Guo et al., "Assessment of Silicon and Carbon Nanotube FET Performance Limits Using a General Theory of Ballistic Transistors", Dec. 2002, Electron Devices meeting, pp. 711–714.*

Franklin, Nathan R. et al., "Integration of Suspended Carbon Nanotube Arrays into Electronic Devices and Eloectromechanical Systems", Applied Physics Letters, vol. 81, No. 5, Jul. 29, 2002, pp. 913–915.

Kong, Jing et al. "Nanotube Molecular Wires as Chemical Sensors", Science, Jan. 28, 2000, pp. 622–625.

Nathan R. Franklin and Hongjie Dai, "An Enhanced CFC Approach to Extensive Nanotube Networks with Directionality", Advanced Materials, vol. 12, No. 12, pp. 890–894 (2000).

* cited by examiner

Primary Examiner—Evan Pert

(57) ABSTRACT

A nano-scale system is provided, and a method of manufacture therefor, including a support material, a nanotube embedded in the support material and an electrical connection to the nanotube.

26 Claims, 6 Drawing Sheets

SYSTEM WITH NANO-SCALE CONDUCTOR AND NANO-OPENING

CROSS-REFERENCE TO RELATED APPLICATION

The present application contains subject matter related to co-pending U.S. patent application Ser. No. 10/150,672 which was filed May 17, 2002, by Nasreen Chopra and entitled "NANOPORE SYSTEM USING NANOTUBES AND $C_{60}$ MOLECULES". The related application is assigned to Agilent Technologies, Inc.

BACKGROUND

1. Technical Field

The present invention relates generally to submicroscopic structures and more particularly to sub-microscopic wires and openings.

2. Background Art

In many fields, especially biology and electronics, it has become important to be able to form smaller and smaller openings and electrical wires in order to be able to advance the technology by providing smaller and more sensitive devices.

For example in biology, it has become important to be able to study single-stranded DNA and RNA in various fields, such as medicine and biological research. By studying DNA and RNA, various diseases can be detected and treated.

Unfortunately, the individual components of the DNA and RNA are nano-scale structures ($10^{-9}$ meter and below), which are sub-microscopic and cannot be identified directly. For example, a single-stranded DNA is made up of a number of components called "nucleotides", which are designated by the letters A, C, G, and T (for adenine, cytosine, guanine, and thymine). The human genome is about 3.2 billion nucleotides long, which is analogous to a million-page book having different length words and 3,200 letters per page.

In order to be able to identify a single-stranded DNA or RNA, it is necessary to be able to process one strand at a time. Unfortunately, there is currently no method that allows a direct measurement of one strand or even a method to line up the single strands in such a way that the strands may be identified.

The ideal would be to electronically sense biological polymers, like RNA, DNA, and proteins, and also unlabeled polynucleotides at a molecular level so as to be able to characterize individual molecules with regard to length, type, and sequence. This would be accomplished by passing a strand of molecules through an opening in a film and electronically sensing the molecules. In addition to a problem forming the electrodes for the electronic sensing, the major problem has been with making an opening small enough that only one strand of molecules would pass through.

Methods used in the past for creating the required opening included both organic and inorganic techniques.

In an example of an organic technique, a lipid bilayer membrane would be stretched across a 30-$\mu$ hole in a piece of PTFE (such as Teflon(TM)) separating two compartments filled with buffer fluids. Molecules of a protein, $\alpha$-hemolysin, would be added to one of the buffer-filled compartments and the $\alpha$-hemolysin would interact with the lipid bilayer membrane for five minutes. Generally, an ion channel would form in the membrane, after which the remaining $\alpha$-hemolysin was immediately flushed out to prevent other openings from forming. However, there were a number of problems including drifting of the opening due to the fluid nature of the membrane, the instability of the opening due to surrounding conditions (such as pH, temperature, etc.), and the inability to adjust the size of the opening.

In an example of an inorganic technique, a freestanding silicon nitride film was sputtered using a focused ion beam (FIB) to create an initial opening in the film. A low energy argon ion beam was then used to melt the film around the initial opening to close or open the opening to a desired size. This has also been problematic due to the difficulty of controlling the material at the final perimeter of the opening to provide circular openings. Often the openings would be somewhat irregularly shaped and not completely circular. Further, the processes often were not predictable, not robust, and/or were time-consuming for forming single openings even when successful.

Another problem with the prior art related to providing the openings with probe electrodes, which would allow electrical sensing of molecules in the opening. Previously, there was no method for providing small enough metallic probes for the small openings or for properly locating metallic probes with respect to the small openings. This problem correlates with problems in the electronics field generally.

For example, in electronics, it is desirable to have smaller and smaller structures to conduct electricity. This is both to be able to reduce the size of electronic devices such as microprocessors, as well as to be able to place them closer together to speed up operation. Present day wires and structures used in devices such as microprocessors are 100 nm meter in size and this small size still is so large that it limits how small the devices can be manufactured. Smaller devices have many advantages including higher speed, lower cost, and lower power requirements.

Solutions to these problems have been long sought, but have long eluded those skilled in the art.

SUMMARY OF THE INVENTION

The present invention provides a system, and a method of manufacture therefor, including a support material, a nanotube embedded in the support material and an electrical connection to the nanotube. The present invention provides a system with nano-sized structures for molecular measurement and higher speed devices. Nanowires are made possible and by producing nano-openings of a known size at a known location it is possible to manufacture nano-openings in predictable locations and with a less time-consuming process.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
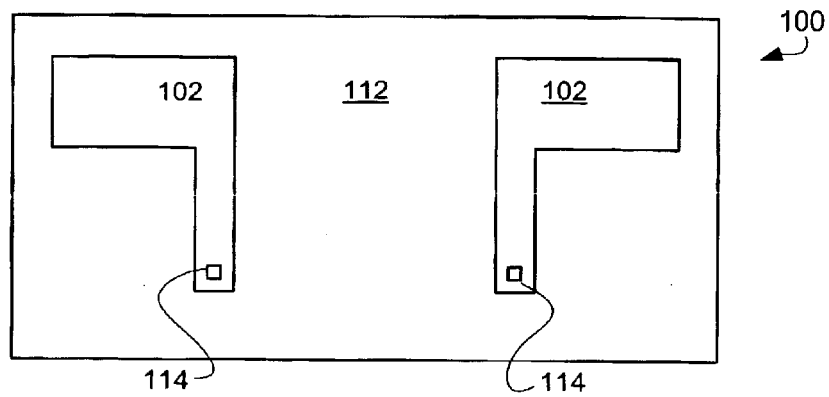
FIG. 1 is a plan view of a nanowire support system in accordance with the present invention.

Referring now to FIG. 1, therein is shown a nanowire support system 100 in accordance with the present invention. The nanowire support system 100 is the base upon which a nanotube is formed and includes a substrate 112, which may be a silicon wafer or a part of a silicon wafer. In one embodiment, the substrate 112 has two contact pads 102 deposited of a conductive material such as aluminum, gold, or copper. At one end of each of the contact pads 102 is a pillar 114. The material of the pillar 114 can be a conductive material or a conductive material on an insulator.

The term "horizontal" as used herein is defined as a plane parallel to the conventional plane or surface of the substrate 112 regardless of its orientation. The term "vertical" refers to a direction perpendicular to the horizontal as just defined. Terms, such as "on", "above", "below", "side", "higher", "lower", "over", and "under", are defined with respect to the horizontal plane.

Figure 2:
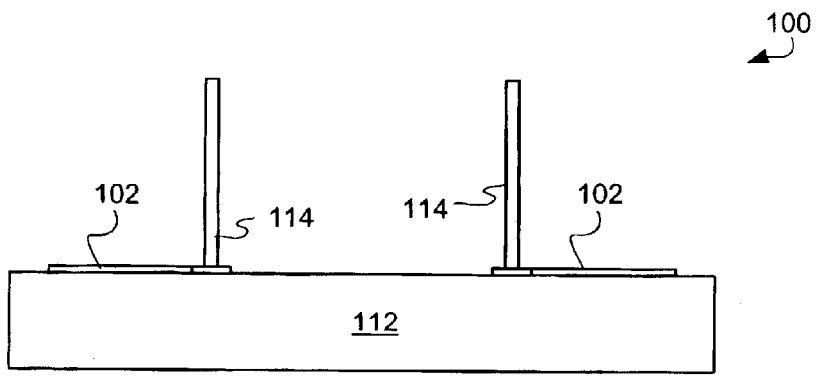
FIG. 2 is a side view of the structure of FIG. 1.

Referring now to FIG. 2, therein is shown a side view of the structure of FIG. 1 better showing the substrate 112, the contact pads 102 and the pillars 114.

Figure 3:
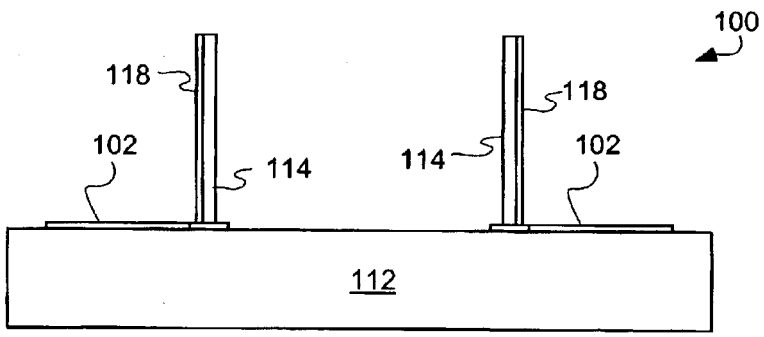
FIG. 3 is the strucuture of FIG. 2 after depositing a conductor.

Referring now to FIG. 3, therein is shown the structure of FIG. 2 where the pillars 114 are of a nonconductive material, such as silicon oxide. A conductive material 118 has been deposited up the vertical sides of the pillars 114. The conductive material 118 is electrically connected to the contact pads 102.

Figure 4:
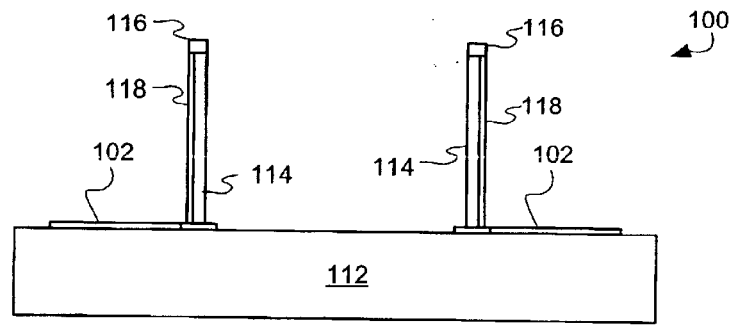
FIG. 4 is the structure of FIG. 3 placing a catalyst precursor.

Referring now to FIG. 4, therein is shown the structure of FIG. 3 after placing a catalyst precursor 116 on top of the pillars 114 and in electrical contact with the conductive material 118. The catalyst precursor 116 can be of conductive materials, such as iron, cobalt, nickel, and a combination thereof. The catalyst precursor 116 is located at the top of each of the pillars 114 and is generally placed there by a stamping or vapor deposition technique.

Figure 5:
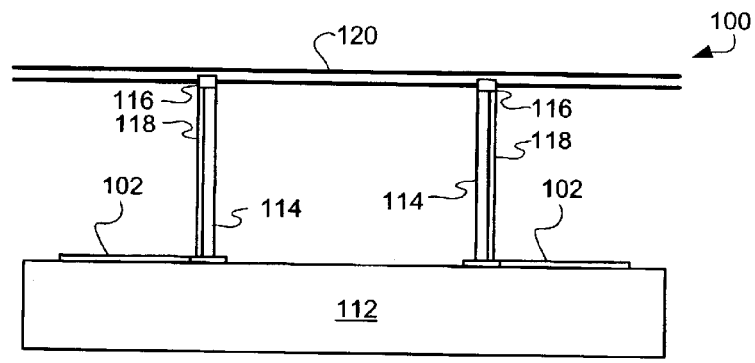
FIG. 5 is the structure of FIG. 4 after deposition of a nanotube.

Referring now to FIG. 5, therein is shown the structure of FIG. 4 having a nanotube 120 grown thereon according to processes that are well known in the art. The nanotube 120 forms on the catalyst precursor 116 on the pillars 114. The nanotube 120 can be conductive, non-conductive, or a semiconductor. The catalyst precursor 116 is conditioned to favor enhanced directional growth so that the nanotube 120 grows in a preferential direction. As a result, the nanotube 120 extends across two or more of the pillars 114.

The nanotube 120 can be described as a long thin strip cut out of a single atomic layer of a material such as carbon and rolled lengthwise to form a cylinder with a nanometer scale diameter and a length on the order of microns. For example, the nanotube 120 can have a wall thickness of one atom thickness and an inside wall-to-wall diameter of 1 to 5 nanometers (nm). Also, by way of example, nanotube structures can be made of a multi-wall nanotube to have inner diameters up to 20 nanometers.

There are several well-known techniques for manufacturing single-walled nanotubes (SWNT) of carbon. Laser ablation techniques have produced tubes with uniform diameters of 1.3 nm and chemical vapor deposition techniques have produced nanotubes that range in diameter from 1 to 3 nm.

The chemical vapor deposition process for growing the nanotube 120 starts by placing the nanowire support system 100 into a furnace at approximately 700° C. to 1000° C. while flowing a carbon containing gas, such as methane, across the catalyst precursor 116 until the nanotube 120 forms.

Figure 6:
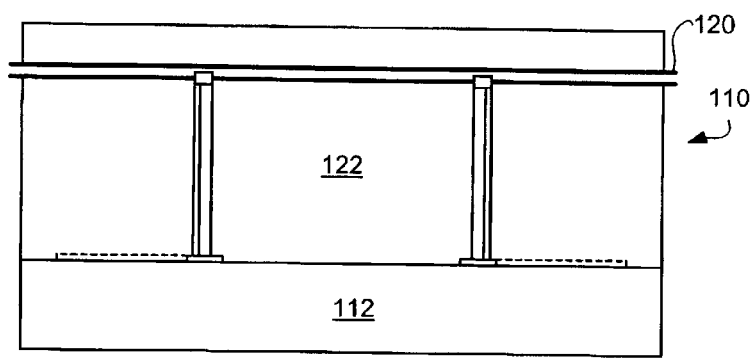
FIG. 6 is a schematic of the structure of FIG. 5 after depositing a support material.

Referring now to FIG. 6, therein is shown a schematic of the structure of FIG. 5 in which the nanotube 120 is embedded in a support material 122 to form a structure 110. A schematic drawing is used since it best discloses the present invention to those having ordinary skill in the art. The support material 122 can be a material such as silicon dioxide, silicon nitride, insulating resin, or even an epoxy.

Figure 7:
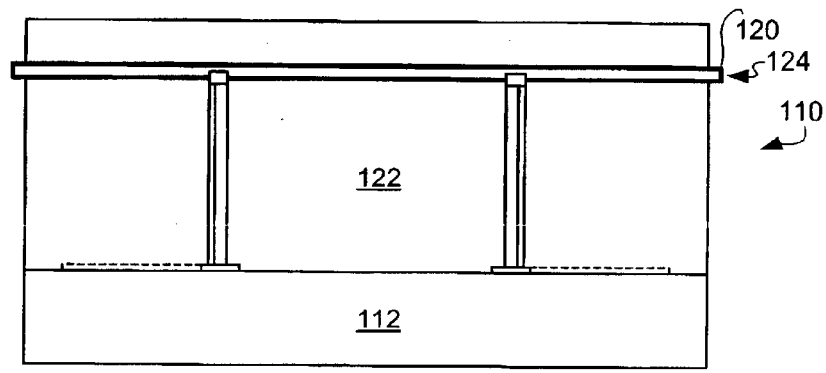
FIG. 7 is the structure of FIG. 6 after forming a nanowire.

Referring now to FIG. 7, therein is shown the structure 110 of FIG. 6 after forming a nanowire 124. The nanotube 120 can form with a variety of electrical properties and the exact electrical properties can be determined by probing the contact pads 102.

For carbon, a nanotube can be conducting, semi-conducting, or non-conducting depending on chirality and diameter. The nanotube can be processed with various combinations of conductive and non-conductive materials to achieve different electrical properties.

When conductive, the nanotube 120 forms the nanowire 124 either without further processing or by filling with a conductive material to increase conductivity or filling with a non-conductive material to increase rigidity.

When non-conductive, the nanotube 120 is coated or filled with a conductive material to form the nanowire 124. Since the wall of the nanotube is of atomic thickness, a conductive connection can be established between the catalyst precursor 116 and the conductive material in the nanowire 124 through the wall.

Figure 8:
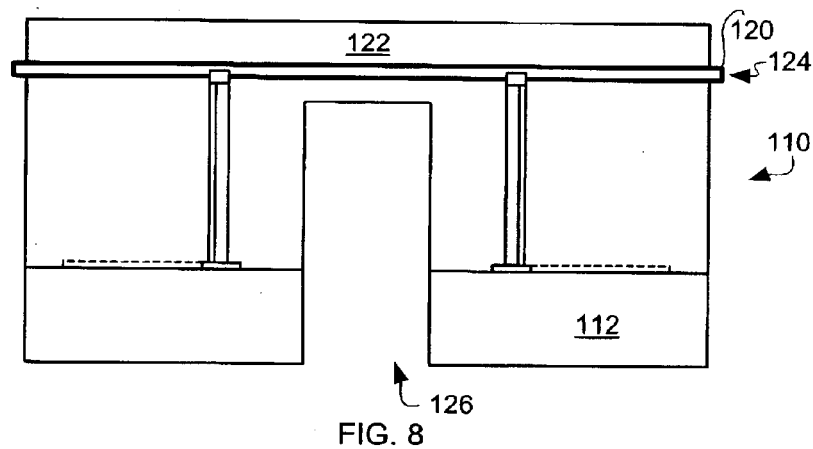
FIG. 8 is the structure of FIG. 7 after forming a recess.

Referring now to FIG. 8, therein is shown the structure of FIG. 7 after forming a recess 126 through the substrate 112 and the support material 122 near the nanowire 124. The recess 126 is formed by an anisotropic etching process.

Figure 9:
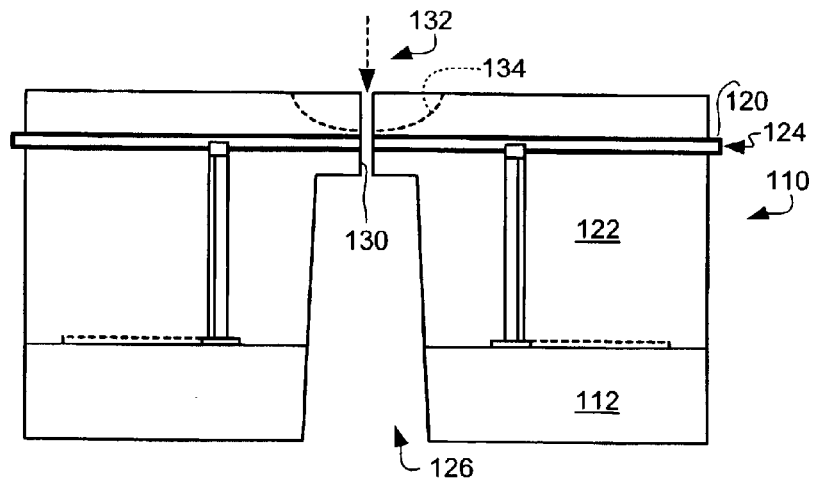
FIG. 9 is the structure of FIG. 8 after forming a nano-opening.

Referring now to FIG. 9, therein is shown the structure of FIG. 8 after forming a nano-opening 130. The forming of the nano-opening 130 presented a major problem because a diameter of less 20 nm was desired for biological applications and no previous method was known for forming an opening at this nano-scale.

The problem was especially great because a nanotube opening had to be vertical to the substrate and vertical nanotubes cannot be predictably located and form as multiple closely located nanotubes.

During research, it was unexpectedly discovered that an electron or ion microscope (not shown) could be used to both image subsurface structures and form the nano-opening 130. Although an electron or ion microscope is intended for viewing sub-microscopic surface structures, it has been discovered that the electrons or ions can be focused to view nanometer size structures and locate such structures under the surface of the support material 122. After locating a subsurface nanotube structure such as the nanotube 120, it was discovered that, when the electron or ion beam of the electron or ion microscope is focused down to an area a few nanometers in diameter, the high density of high-energy electrons or ions can be used to remove material. The removal creates a nanometer diameter opening similar to a drilling operation. As a result, a nanometer-sized electron or ion beam 132 can be used as a nano-diameter "drill" to drill through the support material 122.

In addition, the electron or ion beam 132 can "cut", or divide, the nanowire 124 into separate electrically independent portions; e.g., make two probe tips from the nanowire 124.

To reduce the time necessary to drill through the support material 122, a dimple 134 can be optionally machined into the top of the support material 122 and the recess 126 made as deep as possible to thin the support material 122.

The dimple 134 can also help locate the drilling site for the electron or ion beam 132. The dimple 134 is found by initially imaging the support material 122 using the electron or ion microscope. Once the dimple 134 is found, the electron or ion microscope is focused down to the desired size of the nano-opening 130 and maintained until the nano-opening 130 is drilled through from the top of the support material 122 to the top of the recess 126 in the support material 122.

The electron or ion microscope is then used to re-image and confirm the size and location of the nano-opening 130. The nano-opening 130 is a path of 1-3 nanometers wide (depending on how well the electron or ion beam can be focused) and anywhere from tens or hundreds of nanometers long (depending on how much of the support material 122 is removed).

Figure 10:
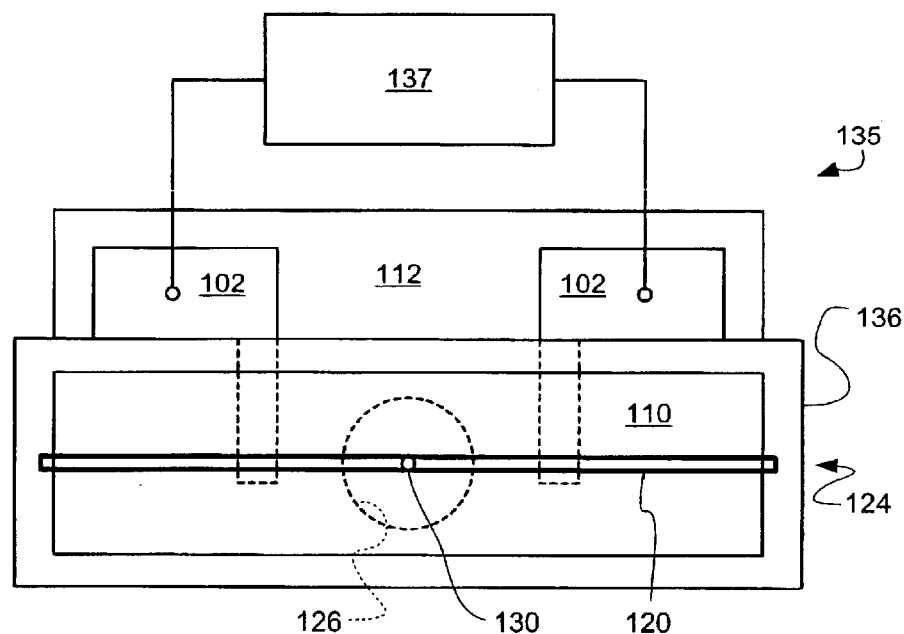
FIG. 10 is a schematic plan view of a molecule identification system.

Referring now to FIG. 10, therein is shown a schematic plan view of the structure 110 of FIG. 9 used in a molecule identification system 135. The structure of FIG. 9 is surrounded by sidewalls 136 and the contact pads 102 are connected for electrical purposes such as measurement or testing to an electronic detection system 137.

Figure 11:
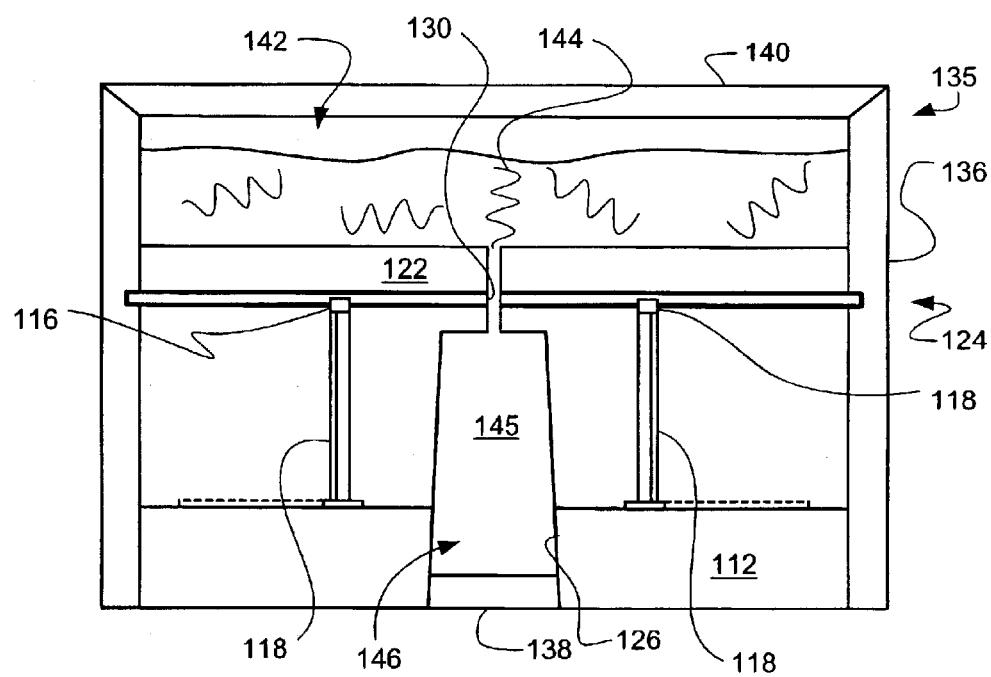
FIG. 11 is a schematic side view of the system of FIG. 10.

Referring now to FIG. 11, therein is shown a schematic side view of the structure of FIG. 10. The molecule identification system 135 has a bottom portion 138 in the recess 126 and a top portion 140 on the sidewalls 136. The support material 122 divides the top and bottom of the molecule identification system 135 into two compartments.

A first compartment 142 contains biological molecules 144 in a supporting fluid 145. Various means, such as fluid pressure or electrical potential or molecular motors, can be used to cause translocation or movement of the biological molecules 144 through the nano-opening 130 into a second compartment 146. The electronic detection system 137 (shown in FIG. 11) is connected by the contact pads 102 (shown in FIG. 11), the conductive material 118, the catalyst precursor 116, and the two ends of the nanowire 124 to identify the biological molecules 144 in the nano-opening 130.

Figure 12:
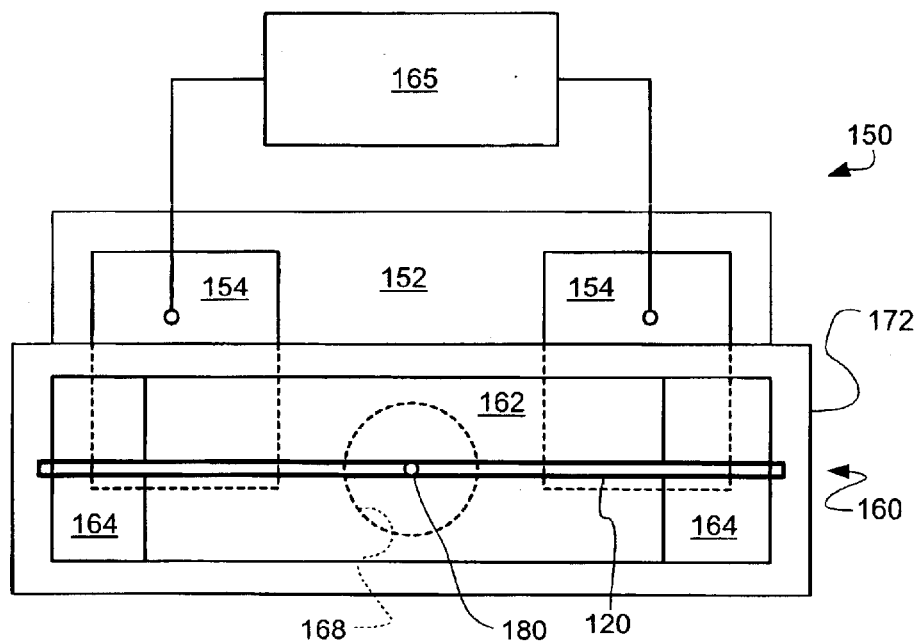
FIG. 12 is a schematic plan view of an alternative embodiment of a molecule identification system used for identifying molecules.

Referring now to FIG. 12, therein is shown a schematic plan view of an alternative embodiment of the present invention of a molecule identification system 150. A substrate 152 is provided with two contact pads 154. Two pillars 156 (shown in FIG. 13) are formed in the same manner as the pillars 114 (shown in FIG. 2) but without the conductive material 118 (shown in FIG. 3). A nanowire 160 is formed in the same way as the nanowire 124 (shown in FIG. 10) and is embedded in a support material 162 in the same way as the embedding of the nanowire 124 in the support material 122 (shown in FIG. 6).

After embedding the nanowire 160 in the support material 162, two contacts 164 are formed at the ends of the nanowire 160 so as to electrically connect the nanowire 160 to the contact pads 154 and an electronic detection system 165. As would be evident to those having ordinary skill in the art from this disclosure, there are many different ways of connecting the ends of the nanowire 160 to the electronic detection system 165.

Figure 13:
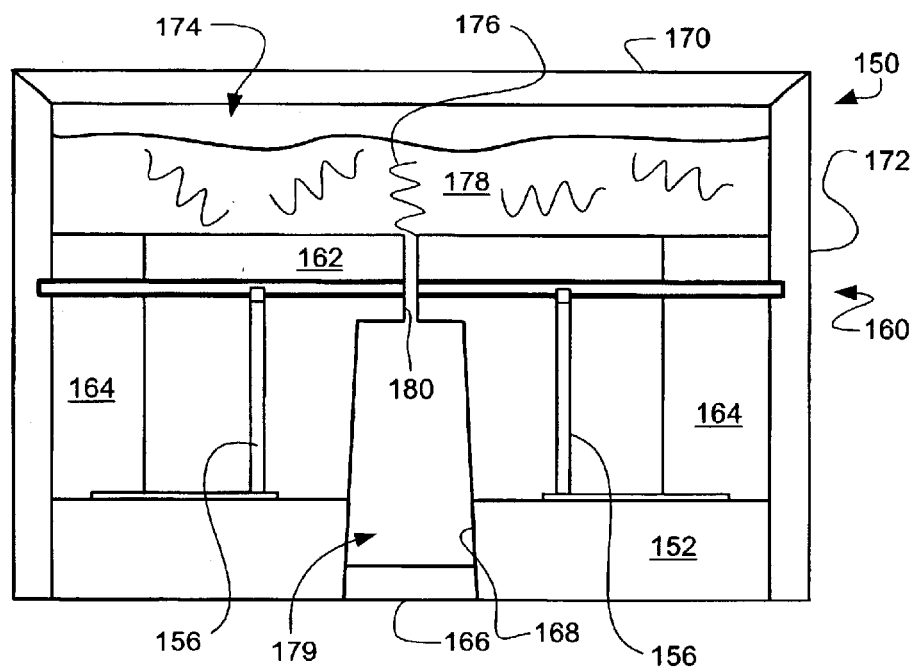
FIG. 13 is a schematic side view of the system of FIG. 12.

Referring now to FIG. 13, therein is shown a schematic side view of the structure of FIG. 12. The molecule identification system 150 has a bottom portion 166 in a recess 160 of the substrate 152 and the support material 162 and a top portion 170 on sidewalls 172. The support material 162 divides the top and bottom of the molecule identification system 150 into two compartments.

A first compartment 174 contains biological polymer molecules 176 in a supporting fluid 178. Various means, such as fluid pressure or electrical potential, can be used to cause translocation of the biological polymer molecules 176 through a nano-opening 180 into a second compartment 179. The electronic detection system 165 is connected by the contact pads 154, the contacts 164, and the ends of the nanowire 160 to identify the biological polymer molecules 176 in the nano-opening 180.

The molecule identification systems 135 and 150 can be used to make measurements on individual molecules as the molecules pass through the nano-openings 130 or 180 by electronically sensing translocating molecules so as to be able to characterize individual molecules with regard to length, type, and sequence in the case of biological polymers like RNA, DNA, and proteins, and also unlabeled polynucleotides. For example, for biological polymers each nucleotide on a single strand of DNA will have a different electronic signature as the strand passes between ends of the nanowire 124 or 160, which form probes, thus a direct measure of the type (ACGT) can be made as well as the sequence and length.

Figure 14:
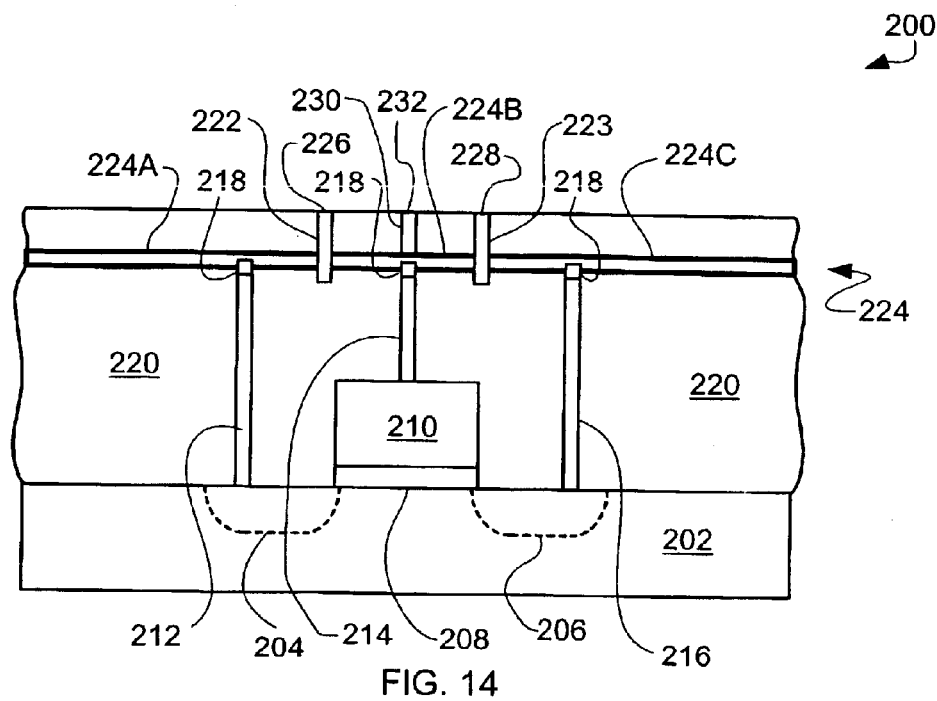
FIG. 14 is a schematic side view of a transistor and transistor interconnects in accordance with the present invention.

Referring now to FIG. 14, therein is shown a schematic side view of a semiconductor device 200 having a transistor and transistor interconnects in accordance with the present invention. A semiconductor substrate 202 is provided having source/drain regions 204 and 206. A gate dielectric 208 and a gate 210 have been formed above the semiconductor substrate 202.

Conductive pillars 212, 214, and 216 have been respectively formed on the source region 204, the gate 210, and the drain region 206. The conductive pillars 212, 214, and 216 are topped with a catalyst precursor 218.

A nanowire 224 has been formed across the conductive pillars 212, 214, and 216, and has been imbedded in a support material 220.

Two nano-openings 222 and 223 have been drilled which cut the nanowire 224 into three electrically separate portions 224A, 224B, and 224C. The two nano-openings 222 and 223 are respectively filled with insulators 226 and 228. A nano-opening 230 has also been drilled down to the electrically separate portion 224B and filled with a conductor 232.

As would be obvious to those having ordinary skill in the art from the above disclosure, the conductive pillars 212, 214, and 216 respectively act as source, gate, and drain contacts. The three electrically separate portions 224A, 224B, and 224C act as semiconductor device interconnects. Other configurations of semiconductor devices will also be obvious based on this disclosure of the invention.

Figure 15:
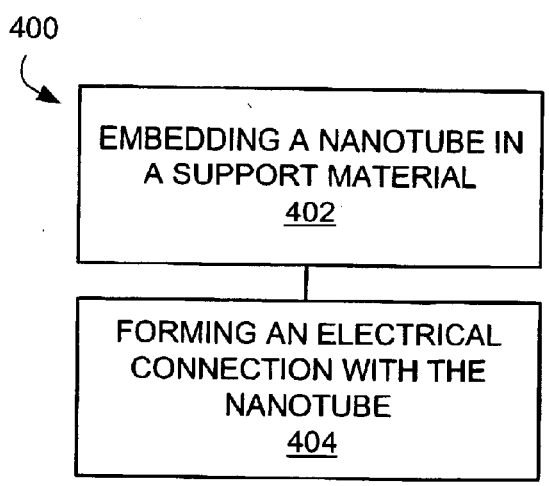
FIG. 15 is a flow chart of the method of the present invention.

Referring now to FIG. 15, therein is shown a flow chart 400 of the method of the present invention. The flow chart 400 includes: a step 402 of embedding a nanotube in a support material; and a step 404 of forming an electrical connection with the nanotube.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method for manufacturing a system with a nano-scale conductor comprising:
   forming a nanotube on a support structure;
   embedding the nanotube in a support material;
   forming a nano-opening in the support material to the nanotube; and
   forming an electrical connection with the nanotube.

2. The method as claimed in claim 1 additionally comprising:
   locating the nanotube in the support material; and
   forming a nano-opening in the support material and through the nanotube to cut the nanotube into separate portions.

3. The method as claimed in claim 1 additionally comprising:
   forming a nano-opening in the support material;
   dividing the nanotube into separate portions;
   forming means around the support material for translocating molecules through the nano-opening; and
   providing an electronic detection system connected to the separate portions for electronically sensing translocating molecules in the nano-opening.

4. The method as claimed in claim 1 additionally comprising:
   providing a semiconductor device;
   forming conductive pillars on portions of the semiconductor device;
   forming the nanotube on the conductive pillars; and
   forming the nanotube into semiconductor device interconnects.

5. The method as claimed in claim 1 additionally comprising rendering the nanotube conductive by a process selected from a group consisting of filling, coating, and a combination thereof the nanotube with a material selected from a group consisting of a conductive material, a non-conductive material, a semi-conductive material, and a combination thereof.

6. The method as claimed in claim 1 wherein forming the electrical connection includes a process selected from a group consisting of forming conductive pillars over a substrate and depositing the nanotube on the conductive pillars, forming electrical contacts at the ends of the nanotube, forming a nano-opening to the nanotube and filling with a conductive material, and a combination thereof.

7. A method for manufacturing a system with a nano-scale conductor comprising:
   forming a carbon nanotube on a support structure;
   embedding the carbon nanotube in a support material to form a carbon nanowire;
   forming a nano-opening in the support material to the carbon nanotube; and
   forming an electrical connection with the carbon nanowire for making electrical measurements.

8. The method as claimed in claim 7 wherein forming the nano-opening in the support material to the carbon nanowire uses an electron or ion beam of an electron or ion microscope.

9. The method as claimed in claim 7 additionally comprising:
   using an electron or ion beam of an electron or ion microscope to locate the carbon nanowire in the support material; and
   forming a nano-opening through the support material and through the carbon nanowire to cut the carbon nanowire into separate portions using an electron or ion beam.

10. The method as claimed in claim 7 additionally comprising:
    forming a nano-opening through the support material dividing the carbon nanowire into separate portions using an electron or ion beam;
    forming means around the support material for translocating molecules through the nano-opening; and
    providing an electronic detection system connected to the separate portions for electronically sensing translocating biological molecules in a fluid in the nano-opening.

11. The method as claimed in claim 7 additionally comprising:
    providing a semiconductor device including a transistor having a source region, a drain region, and a gate;
    forming conductive pillars on the source region, the drain region, and the gate;
    forming the carbon nanowire on the conductive pillars; and
    forming the carbon nanowire into source region, drain region, and gate interconnects.

12. The method as claimed in claim 7 additionally comprising rendering the carbon nanowire conductive by a process selected from a group consisting of filling, coating, and a combination thereof the carbon nanowire with a material selected from a group consisting of a conductive material, a non-conductive material, and a combination thereof.

13. The method as claimed in claim 7 wherein forming the electrical connection includes a process selected from a group consisting of forming conductive pillars over a substrate and depositing the carbon nanowire on the conductive pillars, forming electrical contacts at the ends of the carbon nanowire, forming a nano-opening to the carbon nanowire and filling with a conductive material, and a combination thereof.

14. A system with a nano-scale conductor comprising:
    a support material;
    a formation support structure;
    a nanotube formed on the formation support structure, the nanotube embedded in the support material wherein the support material has a nano-opening provided therein to the nanotube; and
    an electrical connection to the nanotube.

15. The system as claimed in claim 14 wherein the support material has a nano-opening provided therein and the nanotube has separate portions.

16. The system as claimed in claim 14 additionally comprising:
   the support material having a nano-opening provided therein which divides the nanotube into separate portions;
   means around the support material for translocating molecules through the nano-opening; and
   an electronic detection system connected to the separate portions for electronically sensing translocating molecules in the nano-opening.

17. The system as claimed in claim 14 additionally comprising:
   a semiconductor device;
   conductive pillars on portions of the semiconductor device;
   the nanotube on the conductive pillars; and
   the nanotube are semiconductor device interconnects.

18. The system as claimed in claim 14 wherein the nanotube has a structure selected from a group consisting of filled, coated, and a combination thereof with a material selected from a group consisting of a conductive material, a non-conductive material, and a combination thereof.

19. The system as claimed in claim 14 wherein the electrical connection is selected from a group consisting of conductive pillars over a substrate and the nanotube on the conductive pillars, electrical contacts at the ends of the nanotube, the support material having a nano-opening provided therein to the nanotube and filled with a conductive material, and a combination thereof.

20. A system with a nano-scale conductor comprising:
   a support material;
   a formation support structure
   a carbon nanowire embedded in the support material, the carbon nanowire formed on and supported by the formation support structure wherein the support material has a nano-opening provided therein to the carbon nanotube; and
   an electrical connection to the carbon nanowire for making electrical measurements.

21. The system as claimed in claim 20 wherein the support material has the nano-opening having an electron or ion beam diameter.

22. The system as claimed in claim 20 wherein the support material has a nano-opening provided therethrough having an electron or ion beam diameter and the carbon nanowire is in separate portions.

23. The system as claimed in claim 20 additionally comprising:
   the support material has a nano-opening provided therethrough having an electron or ion beam diameter;
   the carbon nanowire is in separate portions;
   means around the support material for translocating molecules through the nano-opening; and
   an electronic detection system connected to the separate portions for electronically sensing translocating biological molecules in the nano-opening.

24. The system as claimed in claim 20 additionally comprising:
   a semiconductor device including a transistor having a source region, a drain region, and a gate;
   conductive pillars on the source region, the drain region, and the gate;
   the carbon nanowire on the conductive pillars; and
   the carbon nanowire connected to source region, drain region, and gate interconnects.

25. The system as claimed in claim 20 wherein the carbon nanowire structure is selected from a group consisting of filled, coated, and a combination thereof with a material selected from a group consisting of a conductive material, a non-conductive material, semi-conductive, and a combination thereof.

26. The system as claimed in claim 20 wherein the electrical connection is selected from a group consisting of conductive pillars over a substrate and the carbon nanowire on the conductive pillars, electrical contacts at the ends of the carbon nanowire, a conductive material to the nanowire in a nano-opening provided in the support material, and a combination thereof.

* * * * *